(12) United States Patent
Scherr et al.

(10) Patent No.: US 9,509,444 B2
(45) Date of Patent: Nov. 29, 2016

(54) EFFICIENT CHECKSUM COMMUNICATION BETWEEN DEVICES

(71) Applicant: Infineon Technologies AG, Neubiberg (DE)

(72) Inventors: Wolfgang Scherr, Villach/Neulandskron (AT); Christian Reidl, Villach (AT); Michael Strasser, Villach (AT); Veikko Summa, Villach (AT)

(73) Assignee: Infineon Technologies AG, Neubiberg (DE)

( * ) Notice: Subject to any disclaimer, the term of this patent is extended or adjusted under 35 U.S.C. 154(b) by 68 days.

(21) Appl. No.: 14/317,661

(22) Filed: Jun. 27, 2014

(65) Prior Publication Data

US 2015/0269019 A1    Sep. 24, 2015

Related U.S. Application Data (60) Provisional application No. 61/968,049, filed on Mar. 20, 2014.

(51) Int. Cl.
| | |
|---|---|
| *H03M 13/00* | (2006.01) |
| *H04L 1/00* | (2006.01) |
| *H03M 13/09* | (2006.01) |
| *H04L 1/24* | (2006.01) |

(52) U.S. Cl.
CPC ............ *H04L 1/0061* (2013.01); *H03M 13/09* (2013.01); *H04L 1/0046* (2013.01); *H04L 1/24* (2013.01)

(58) Field of Classification Search
CPC ............................... H04L 1/0061; H04L 1/24
See application file for complete search history.

(56) References Cited

U.S. PATENT DOCUMENTS

| | | | |
|---|---|---|---|
| 4,388,725 A | 6/1983 | Saito et al. | |
| 4,531,068 A | 7/1985 | Kraft et al. | |
| 5,646,996 A * | 7/1997 | Latka ................. | G07C 9/00182 375/358 |
| 5,787,132 A | 7/1998 | Kishigami et al. | |
| 6,060,906 A | 5/2000 | Chow et al. | |
| 6,201,811 B1 | 3/2001 | Larsson et al. | |
| 6,275,550 B1 | 8/2001 | Fukuda | |
| 6,405,337 B1 * | 6/2002 | Grohn ....................... | H04L 1/18 714/749 |
| 6,496,889 B1 | 12/2002 | Perino et al. | |
| 6,609,224 B1 | 8/2003 | Jonsson | |
| 6,977,930 B1 * | 12/2005 | Epps ................... | H04L 12/5693 370/392 |

(Continued)

FOREIGN PATENT DOCUMENTS

| | | |
|---|---|---|
| DE | 102008031498 A1 | 1/2010 |
| JP | S56153866 A | 11/1981 |

(Continued)

OTHER PUBLICATIONS

Non Final Office Action Dated Dec. 18, 2015 U.S. Appl. No. 14/934,729.

(Continued)

*Primary Examiner* — Esaw Abraham
(74) *Attorney, Agent, or Firm* — Eschweiler & Associates, LLC (57) ABSTRACT

Methods and devices are provided wherein feedback is included in a checksum. An example method includes communicating between a first device and a second device. The method further includes including feedback information used by the first device as input to a checksum calculation, wherein the feedback information is not communicated concurrently with the checksum from the first device to the second device.

13 Claims, 8 Drawing Sheets

(56) References Cited

U.S. PATENT DOCUMENTS

| | | | |
|---|---|---|---|
| 7,027,773 B1* | 4/2006 | McMillin | H04W 40/02 370/390 |
| 7,269,774 B2* | 9/2007 | Sudo | H04L 1/0021 714/704 |
| 7,627,121 B1* | 12/2009 | Reeds, III | H04L 9/12 380/260 |
| 7,627,804 B2* | 12/2009 | Bains | G06F 11/1004 712/218 |
| 7,653,757 B1 | 1/2010 | Fernald et al. | |
| 7,809,870 B2* | 10/2010 | McDaniel | H04L 63/123 710/105 |
| 8,183,982 B2 | 5/2012 | Scherr | |
| 8,301,972 B2* | 10/2012 | Tang | H03M 13/096 714/758 |
| 8,519,819 B2 | 8/2013 | Scherr | |
| 8,948,280 B2 | 2/2015 | Hammerschmidt et al. | |
| 2004/0107398 A1* | 6/2004 | Johnson | H03M 13/09 714/758 |
| 2005/0127942 A1 | 6/2005 | Smith et al. | |
| 2007/0088883 A1 | 4/2007 | Wakabayashi | |
| 2008/0198917 A1 | 8/2008 | Mignone | |
| 2009/0046773 A1 | 2/2009 | Scherr | |
| 2010/0002821 A1 | 1/2010 | Hammerschmidt et al. | |
| 2010/0262887 A1* | 10/2010 | Wilson | H04L 1/0045 714/758 |
| 2011/0280299 A1 | 11/2011 | O'Malley et al. | |
| 2014/0101349 A1 | 4/2014 | Engl | |
| 2015/0200706 A1 | 7/2015 | Bottazzi et al. | |
| 2015/0236876 A1 | 8/2015 | Cadugan et al. | |

FOREIGN PATENT DOCUMENTS

| | | |
|---|---|---|
| JP | 58-024925 | 2/1983 |
| JP | 08-023582 | 1/1996 |
| JP | 2003189654 A | 7/2003 |
| JP | 2013017094 A | 1/2013 |

OTHER PUBLICATIONS

Non-Final Office Action dated May 13, 2015 in connection with U.S. Appl. No. 14/318,741.
Non Final Office Action Dated Jan. 11, 2016 U.S. Appl. No. 14/458,745.
Final Office Action Dated Sep. 1, 2015 U.S. Appl. No. 14/458,745.
"TLE4998C3, TLE4998C4 Programmable Linear Hall Sensor"; Data Sheet, Rev 1.0, Infineon Technologies AG, Dec. 2008, p. 1-44.
U.S. Appl. No. 14/318,741, filed Jun. 30, 2014.
U.S. Appl. No. 14/458,745, filed Aug. 13, 2014.
Non Final Office Action Dated Apr. 2, 2015 U.S. Appl. No. 14/458,745.
Notice of Allowance Dated Jul. 31, 2015 U.S. Appl. No. 14/318,741.
Final Office Action Dated Jul. 1, 2016 U.S. Appl. No. 14/458,745.
Kramolis, J. "SENT/SPC Driver for the MPC5510 Microcontroller Family." Freescale Semiconductor, Inc. Document No. AN4219, Rev. 0, Oct. 2010. 28 pages.
Notice of Allowance Dated May 31, 2016 U.S. Appl. No. 14/934,729.

* cited by examiner

EFFICIENT CHECKSUM COMMUNICATION BETWEEN DEVICES

REFERENCE TO RELATED APPLICATION

This application claims priority to U.S. provisional application No. 61/968,049 filed on Mar. 20, 2014.

BACKGROUND

For communication between devices, for example in automotive applications, various protocols are used. One protocol frequently employed is the SENT protocol (single edge nibble transmission). This protocol may for example be used in applications where high resolution data is transmitted for example from a sensor device to an electronic control unit (ECU).

The SPC protocol (short PWM code; PWM meaning pulse width modulation) is an extension of the SENT protocol and aims at increasing performance of a communication link and reducing system costs at the same time. To some extent, SPC allows bidirectional communication and is an example of an edge based PWM protocol. For example, SPC may introduce a half-duplex synchronous communication. A receiver (e.g. master) generates for example a master trigger pulse on a communication line by pulling it low for a defined amount of time. The pulse width (corresponding to the defined amount of time) is measured by a transmitter (e.g. slave), for example a sensor, and a transmission, e.g. a SENT transmission, is initiated only if the pulse width is within a defined limit. The SPC protocol allows choosing between various protocol modes. For example, a synchronous mode, a synchronous mode with range selection or a synchronous transmission with ID selection, where up to four sensors may be connected in parallel to an ECU, may be used. In the latter case, the pulse width of the abovementioned trigger pulse may define which sensor or other entity will start a transmission. For example, a length of the trigger pulse may indicate an ID of a sensor or other slave device selected for transmission. The sensor or other entity may start the transmission with its own synchronization, which may overlap data pulses.

Conventionally, in the SPC protocol following a master request no feedback has been given. For example, when a master (for example ECU) triggers a slave (for example sensor) with an ID (for example via pulse width), the master, based on a reply alone, could not be sure if indeed the correct slave has responded. Similar considerations apply in a point-to-point transmission with using an area switching or other switching between sectors, zones, ranges, or regions based on a master request. In some implementations, bits in a data frame have been used for giving feedback. This uses bandwidth which otherwise could be used for data transmission.

In other circumstances, a master may not be sure that data transmitted are up to date or if always the same information is transmitted (which apart from a transmission without request is a possible additional error mode of this general problem, which is also known as "Babbling Idiot").

DETAILED DESCRIPTION

In the following, various embodiments will be described in detail referring to the attached drawings. The embodiments are to be regarded as illustrative examples only and are not to be construed as limiting. For example, while embodiments may be described as comprising a plurality of features or elements, in other embodiments some of these features or elements may be omitted, and/or replaced by alternative features or elements. In yet other embodiments, additional features or elements may be provided.

Any connections or couplings shown in the drawings or described herein may be implemented as direct connections or couplings, i.e. connections or couplings without intervening elements, or indirect connections or couplings, i.e. connections or couplings with one or more intervening elements, as long as the general purpose of the connection or coupling, for example to transmit a certain kind of signal and/or to transmit a certain kind of information, is essentially maintained. Connections or couplings may be wire-based connections or couplings or may also be wireless connections or couplings unless noted otherwise.

Furthermore, features from different embodiments may be combined to form additional embodiments.

In embodiments, an extension to the SPC protocol is proposed. However, these extensions may also be applicable to other communication protocols, for example bidirectional edge-based PWM (pulse width modulation) communication protocols.

In some embodiments, bits conventionally used for transmitting information like feedback to a communication device like a master may be used to transmit payload data, and information/feedback to the master or other communication device in some embodiments may be encoded for example in a checksum, i.e. used for calculation of the checksum. A checksum as used herein may refer to information, for example redundant information, calculated on the basis of other data including data to be sent. At a receiver, based on received data and received checksum it may be possible to detect transmission error. An example for a checksum in this sense is a CRC (cyclic redundancy check) or any other redundant information which may be used to check data integrity. Furthermore, in some embodiments information may be transmitted to keep a timing information (also referred to as date) up to date.

In some embodiments, by encoding a feedback or other information in a checksum no separate transmission of a feedback to a communication device like a master, for example a confirmation, is necessary.

In some embodiments, a method may be provided, comprising: communicating between a slave and a master, and including a feedback from a slave to a master in a checksum.

In some embodiments, the feedback may comprise an identification of the slave.

In some embodiments, the feedback may comprises a counter value.

In some embodiments, the counter value may be a rolling counter value.

In some embodiments, the method may further comprise setting the counter value to a defined value after a transmission error has been detected.

In some embodiments setting the counter value to a defined value may comprise sending a dedicated trigger pulse from a master to at least one slave, and setting the counter value in response to the trigger pulse.

In some embodiments, the dedicated trigger pulse may correspond to an unused identification.

In some embodiments, setting the counter value to a defined value may comprise omitting a trigger signal form the master to at least one slave, and setting the counter in response to detecting the omission of the trigger pulse.

In some embodiments, the method may further comprise trying different counter values after a transmission error to determine a current counter value.

In some embodiments, the master may comprise a control unit.

In some embodiments, the slave may comprise a sensor.

In some embodiments, master and slave may communicate on the basis of an SPC protocol.

In some embodiments, a device may be provided, adapted to carry out at least one of the methods described above.

In some embodiments, the device may be a master device or may be a slave device.

In some embodiments, the above described methods may be implemented in a communication system.

Figure 1:
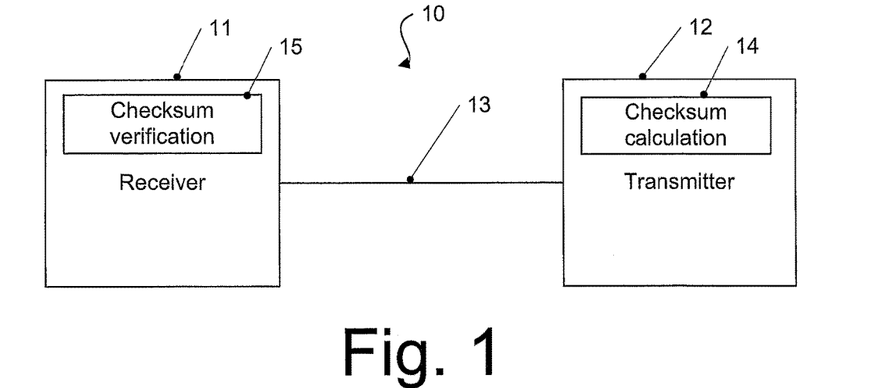
FIG. 1 is a simplified block diagram of a communication system according to some embodiments.

In FIG. 1, a communication system 10 according to an embodiment is shown including a receiver 11 and a transmitter 12. Receiver 11 is communicatively coupled to transmitter 12 via one or more communication paths at 13. In one embodiment, receiver 11 is part of one integrated circuit chip and transmitter 12 is part of another integrated circuit chip. In other embodiments, receiver 11 and transmitter 12 may be part of a same integrated circuit chip. In one embodiment, receiver 11 may be a controller, for example an ECU. In some embodiments, transmitter 12 may be a sensor or other device. In some embodiments, receiver 22 and transmitter 24 may communicate via a SPC protocol or other bidirectional edge-based PWM protocol with additions as outlined below. An edge-based PWM protocol is a protocol where edges of pulse width modulated signals are detected, and information like data to be transmitted is encoded e.g. in pulse lengths of the pulse width modulated signal. In other embodiments, other communication techniques may be used. In some embodiments, information to be transmitted, for example a feedback from transmitter to receiver, is not sent in a data field, but only encoded in a checksum, e.g. by a checksum calculation entity 14. Such information may for example include an identification (ID) of the transmitter or may include a counter value or may include a measuring range setting or any combination thereof, e.g. a counter value and an identification. For generating the checksum, the information is one of the input values for an algorithm which generates the checksum. In addition to the information other input values for the algorithm include the data which are transmitted in a data field. In a checksum verification entity 15 of receiver 11 in some embodiments the checksum may then be verified e.g. based on the data transmitted in the data field and further information present in receiver 11. In some embodiments, the information used for checksum calculation and the further information in error-free operation may be consistent information.

Figure 2:
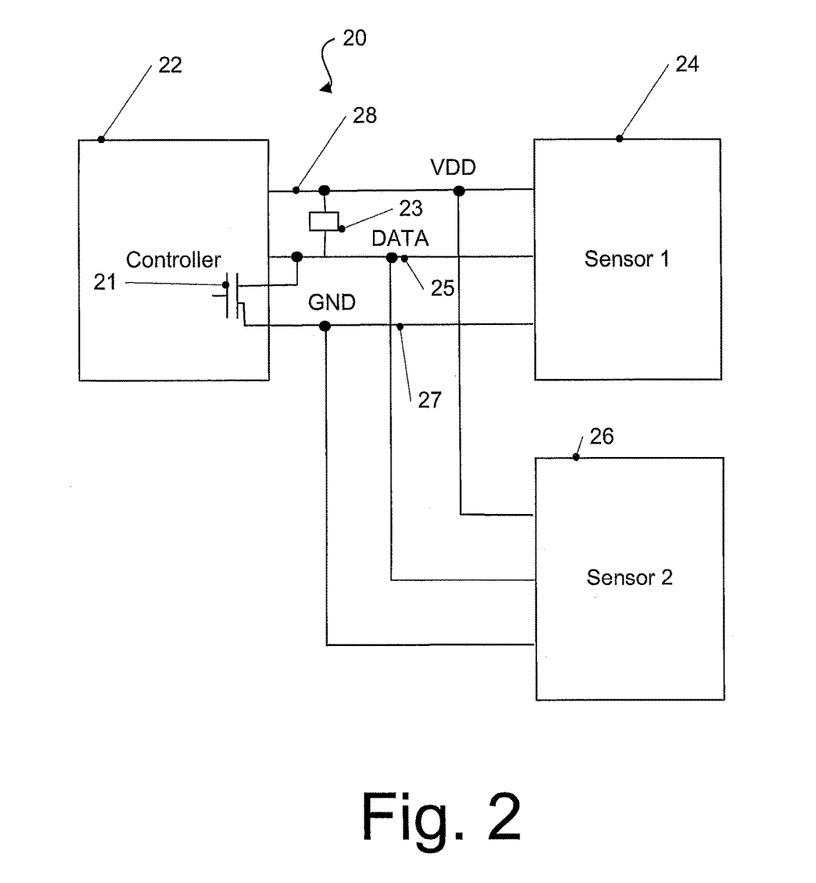
FIG. 2 is a block diagram of a communication system according to an embodiment.

In other embodiments, as illustrated in FIG. 2, a receiver or other controller 22 (e.g. master) may communicate with a plurality of transmitters, for example sensors 24 and 26 in a system 20. Controller 22 in the embodiment shown is electrically coupled to each of sensors 24 and 26 via a three-wire connection. In other embodiments, two-wire connections or any other connections may be used. Controller 22 may communicate with sensors 24 and 26 e.g. via an SPC protocol or other bidirectional edge-based PWM protocol, with additions as outlined below. In the embodiment shown in FIG. 2, electrically coupling the three-wire connection controller 22 to first sensor 24 and second sensor 26 comprises a VDD power supply line 28, a data line 25 and a reference line such as ground line 27. In an embodiment, system 20 may be part of an automobile's electrical system. In other embodiments, other numbers of sensors or other components may be used. In an embodiment, controller 22 communicates with first sensor 24 and second sensor 26 via open drain/open collector interfaces including one or more pull-up resistors. For example, system 20 includes a pull-up resistor 23 that has a first end electrically coupled to power supply line 28 and a second end electrically coupled to data line 25, and controller 22 includes an open drain transistor 21 that has one end of its drain-source path electrically coupled to data line 25 and the other end electrically coupled to ground line 27. Sensors 24 and 26 may comprise similar open drain transistors or current sinks (not shown). Controller 22 and each of the first and second sensors 24 and 26 share a single communication path that is communicating via voltage signals on data line 25, e.g. PWM signals.

When communicating for example according to an SPC protocol, controller 22 may transmit a request signal that is received by the first and second sensors 24 and 26 via data line 25. The request signal may include a trigger signal and/or a sensor identification signal, which selects one of the first and second sensors 24 and 26. In addition, a remainder of the request signal may include any other commands and/or data to be transmitted to the selected sensor. For example, the trigger signal may be a pulse where controller 22 via transistor 21 pulls data line 25 to ground, a duration of the pulse indicating an ID of the sensor. In other embodiments current pulses or other electrical quantities may be used to achieve the same functionality.

The first and second sensors 24 and 26 receive the request signal including the trigger signal and the sensor identification signal. One of the first and second sensors 24 and 26 is selected via the sensor identification signal, for example encoded in a pulse width, pulse height or other, and the selected sensor transmits a reply signal via data line 28.

Figure 3:
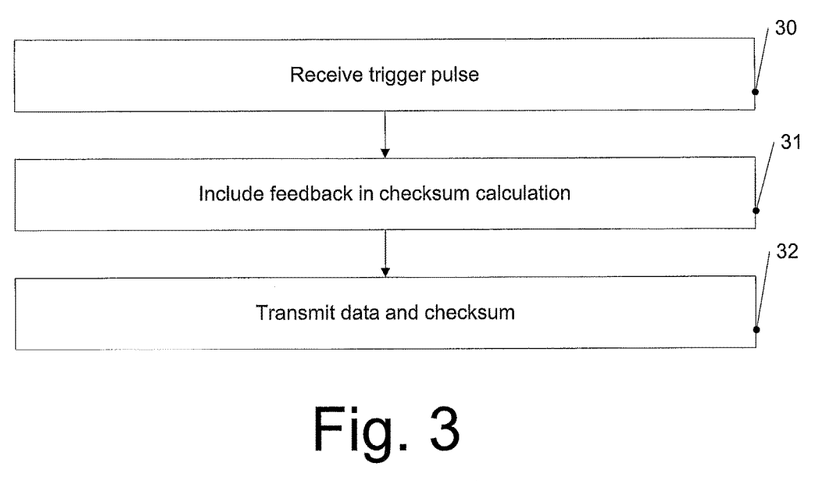
FIG. 3 is a flowchart illustrating a method according to an embodiment.

In FIG. 3, a flowchart illustrating a method according to an embodiment is illustrated. The method of FIG. 3 may be implemented in devices and systems as illustrated with respect to FIGS. 1 and 2, but may also be implemented independently therefrom. For example, the method of FIG. 3 may be implemented by designing or programming a transceiver of transmitter 12 of FIG. 1 or of sensor 24 and/or 26 of FIG. 2 accordingly.

At 30, the method of FIG. 3 comprises receiving a trigger pulse, for example according to an SPC communication protocol or other edge-based PWM communication protocol. A length of the trigger pulse may indicate an ID of a slave in a master-slave system, e.g. an ID of slaves like sensors 24, 26.

Following receipt of the trigger pulse, data is sent together with a checksum like a cyclic redundancy check. At 31, the method of FIG. 3 comprises including information, e.g. a feedback like the above-mentioned ID or a counter like a rolling counter in the calculation of the checksum. At 32, data is transmitted together with the checksum, for example in a data frame. However, in embodiments the above-mentioned information is not included in the data frame, but only used for checksum calculation. Generally, in some embodiments, while the information may have been sent at some point in time, e.g. during initialization, it is not sent associated with the checksum, for example not sent in a data frame or other data unit to which the checksum pertains.

Figure 4:
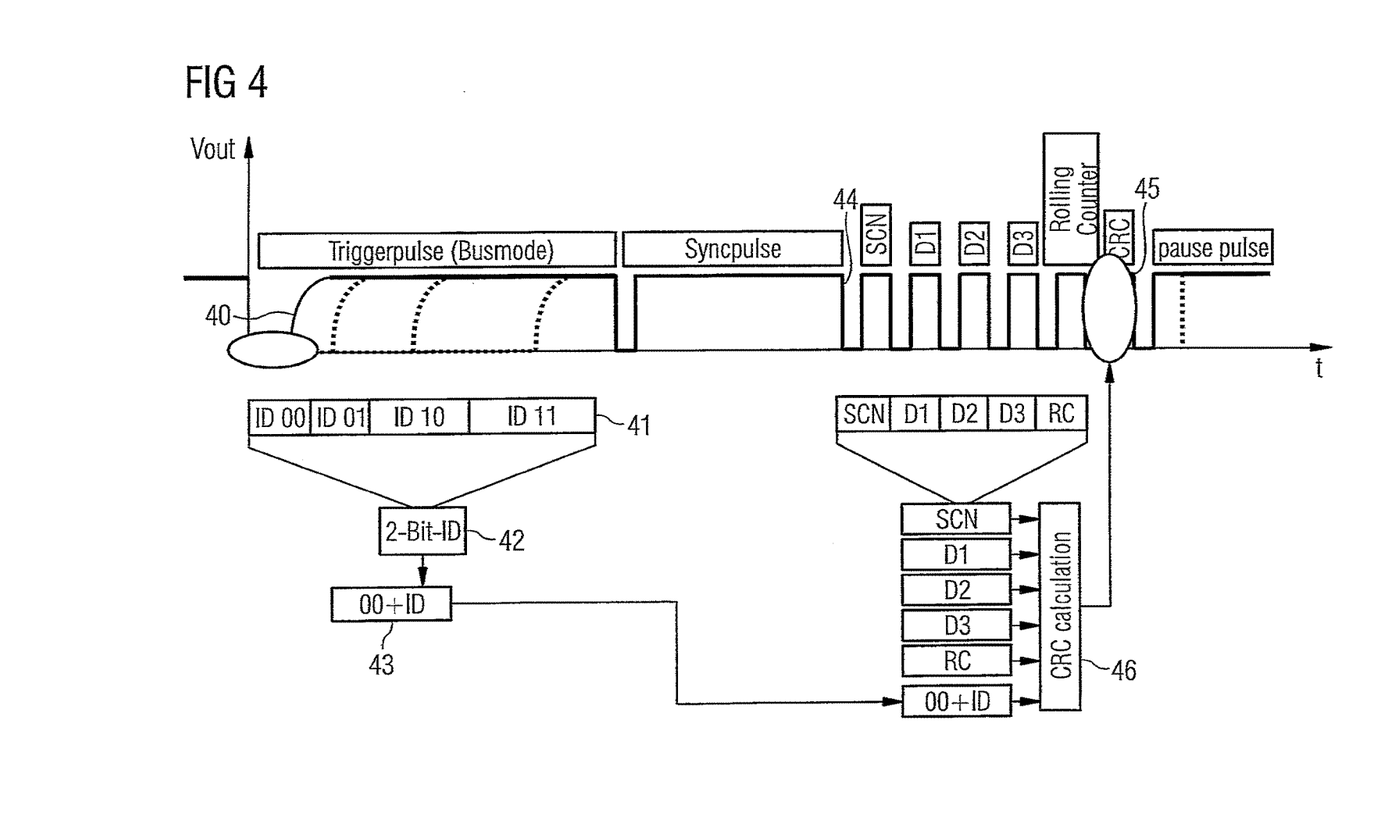
FIG. 4 is a flowchart illustrating signals and techniques according to some embodiments.
Figure 5:
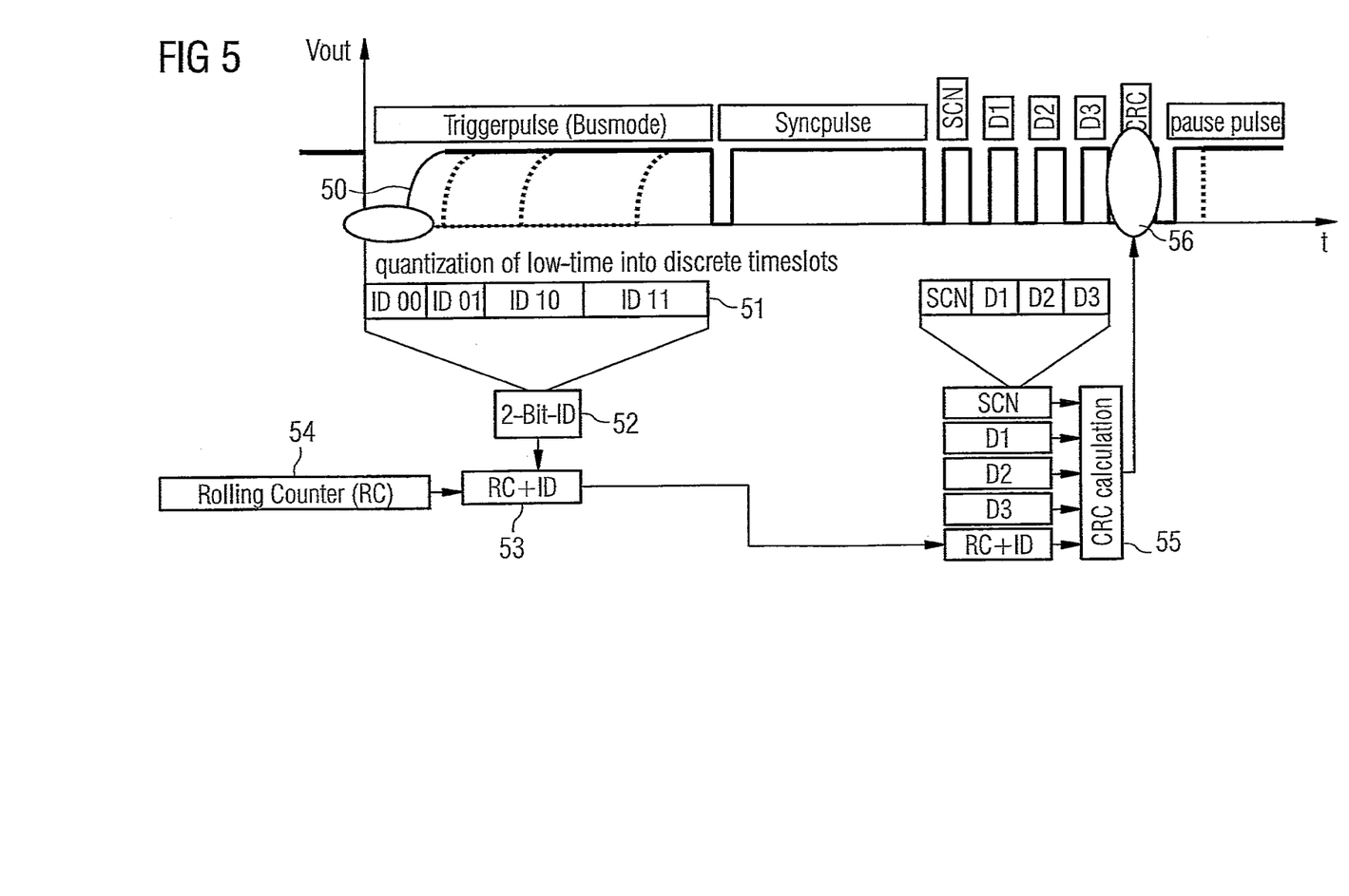
FIG. 5 is a diagram illustrating signals and techniques according to some embodiments.

Concepts of including information in a checksum as discussed above will now be illustrated further referring to FIGS. 4 and 5. FIGS. 4 and 5 show example signals together with elements illustrating techniques disclosed herein. The signals shown serve merely as non-limiting examples, and depending on the implementation signals in other embodiments may have different shapes or forms. Signals of FIG. 4 illustrate signals which may occur in an SPC system operating in a bus mode, where for example a master device communicates with a plurality of slave devices, as illustrated using an example in FIG. 2.

In FIG. 4, a trigger pulse 40 is shown which may be sent from a master device to slave devices to indicate a slave device which is to respond to the trigger pulse. For example, a length of the trigger pulse may indicate an ID of the slave device which is to respond. In FIG. 4, with a solid line an example for a comparatively short trigger pulse 40 is shown, and with dashed lines possible signal curves for longer trigger pulses are illustrated. In embodiments, the ID may be a two-bit number with possible values 00, 01, 10 or 11, as indicated by a box 41 in FIG. 4. Each length of the trigger pulse may then be associated with one of the possible IDs. In other embodiments where the system does not operate in a bus mode but in a range mode, the pulse length of the trigger pulse may indicate a range.

As indicated at 43, the two-bit ID value of the receiving slave device may be combined with two 0s (see 43 of FIG. 4) to form a four-bit value.

Following the trigger pulse, as indicated by a curve portion 44 the slave device responds with a sync pulse, and various values SCN, D1 to D3 and a rolling counter (RC) value which are examples for sent data values, followed by a cyclic redundancy check CRC 45 as an example for a checksum. In an SPC system, these data values and the CRC may be four-bit values. In other embodiments, other bit widths may be used. The transmission by the slave device is terminated by a pause pulse, as indicated in FIG. 4. A calculation of the cyclic redundancy check as indicated at 46 in FIG. 4 does not only include the data values actually sent, i.e. SCN, D1, D2, D3 and the rolling counter RC, but also the ID written as a four-bit value (43 of FIG. 4). In this way, the ID is not explicitly sent, but is included in the checksum.

The rolling counter RC may be a four-bit value which is increased by one bit every time the respective slave device sends data terminating with a pause pulse. In the example of FIG. 4, the rolling counter may e.g. be a two-bit value or a four-bit value. In case of a two-bit value, after reaching a value of 11, at the next transmission the counting may start again at 00, hence the name "rolling".

As will be explained later in more detail, when the receiving entity, for example a master device, receives the data, it includes the expected ID (corresponding to the ID indicated by the trigger pulse it sent) in its own checksum calculation, e.g. CRC calculation. If the checksum calculation does not match with the data received (including the expected ID), the master device then knows that either the data has been received incorrectly, the CRC has been received incorrectly or the ID is wrong, which may for example happen if a "wrong" slave device responds to the trigger pulse (for example due to an incorrect decoding of the trigger pulse, for example assuming that the trigger pulse indicates an ID of 01 when it actually was intended to indicate an ID of 00 etc.).

In the example of FIG. 4, the ID is encoded as feedback in the CRC calculation, while the rolling counter is actually sent. In other embodiments, only the rolling counter may be sent, without including the ID in the checksum. In yet other embodiments, also the rolling counter may be included in the checksum calculation. This is indicated in FIG. 5.

A trigger pulse 50 of FIG. 5 and a box indicating possible IDs 51 in FIG. 5 correspond to respective elements 40 and 41 of FIG. 4 and will not be explained again in detail. Moreover, the signal sent by the slave starting with a sync pulse in FIG. 5 corresponds to the signal 44 of FIG. 4 with the exception that no rolling counter is explicitly sent, and the CRC 56 is calculated including a rolling counter, as will be explained below. In FIG. 5, a two-bit ID of the slave is combined with a rolling counter value 54 to form a combined rolling counter and ID value 53. For example, as mentioned in some embodiments, the rolling counter may be a two-bit value, counting 00, 01, 10, 11 and then starting again with 00, just to give an example. Such a two-bit value may be combined with an ID to form a four-bit value, for example at 53 of FIG. 5 (for example first two bits of the four-bit value corresponding to the rolling counter and last two bits corresponding to the ID, or vice versa. This combined rolling counter and ID value is included in the calculation 55 of a cyclic redundancy check (CRC) which is then sent as indicated by 56. Therefore, in the example of FIG. 5 both rolling counter and ID are implicitly sent by encoding in the checksum, but not explicitly sent, while in the example of FIG. 4 only the ID is encoded in the checksum, and the rolling counter is explicitly sent.

Generally, the technique of encoding information or feedback in the checksum may be used for any kind of information which is usually held consistent between transmitter and receiver, i.e. where the receiver knows the expected value. For example, the information may be independently determined at transmitter and receiver according to a predefined scheme. An example for such a predefined scheme is a counter like a rolling counter (e.g. as mentioned above) which increases e.g. in regular intervals or upon specific events like sending or receiving of data. In this case, in embodiments it may not be necessary to explicitly send such information, but it may be sufficient to include the information only in the checksum to be able to detect cases where the information is not consistent anymore.

It should be noted that in FIGS. 4 and 5 the sync pulse by the receiver follows the trigger pulse. In other embodiments, the synchronization pulse of the reply signal by the slave device may overlap the trigger pulse, which is not explicitly shown in FIGS. 4 and 5, but which may be used in some embodiments.

Figure 6:
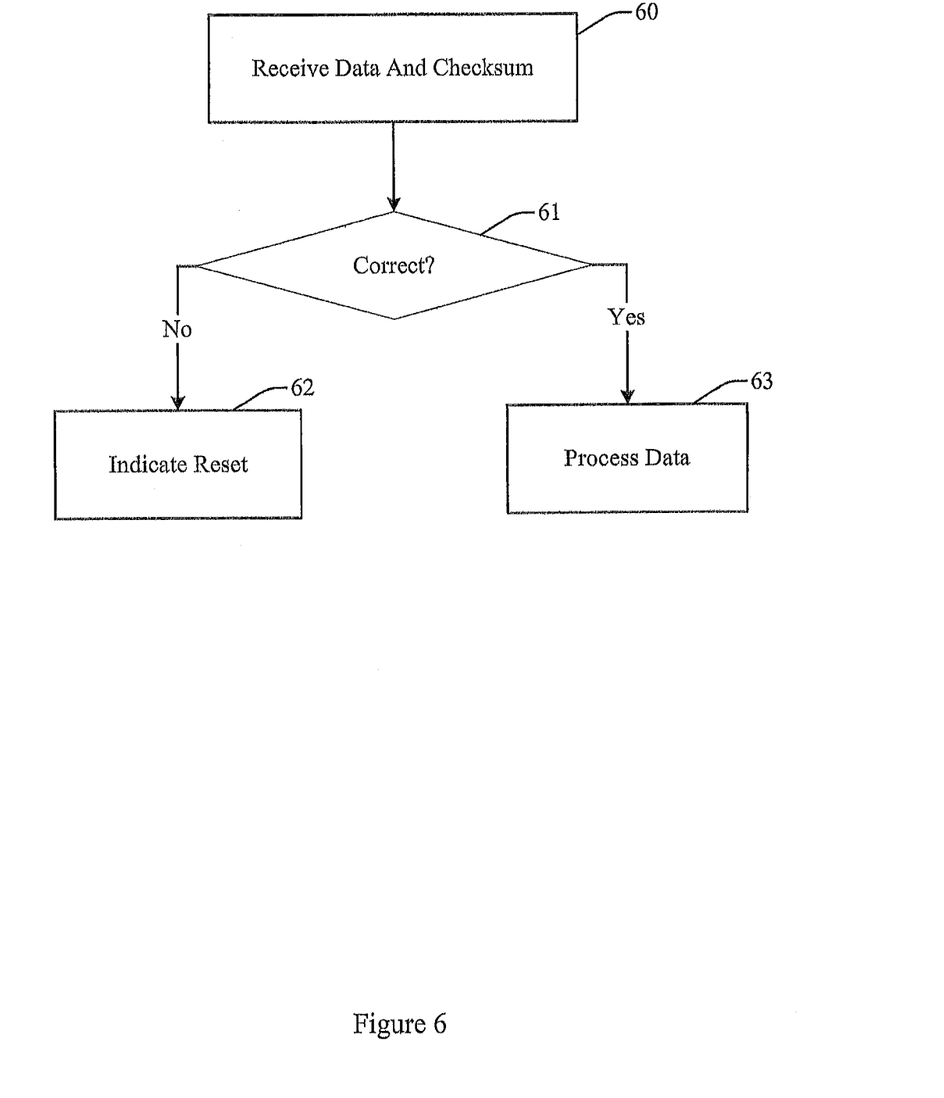
FIG. 6 is a flowchart illustrating a method according to an embodiment.

As already mentioned, at a receiver side, for example a master side, like receiver 11 of FIG. 1 or controller 22 of FIG. 2, when checking the checksum, for example CRC, the receiver side includes the expected information (for example expected ID and/or expected rolling counter) in the data received to calculate its own checksum and to assess whether the checksum is correct. A method according to a corresponding embodiment is illustrated in FIG. 6. The embodiment of FIG. 6 may be implemented in the systems of FIG. 1 or 2, for example in receiver 11 or controller 22 thereof.

At 60, the method of FIG. 6 comprises receiving data together with an associated checksum, for example a cyclic redundancy check (CRC). At 61, the method of FIG. 6 comprises determining if the received checksum is correct, i.e. if the received checksum matches a checksum calculated on the basis of the received data together with expected information like an ID and/or a counter value like a rolling counter value. If the checksum is correct (YES at 61), at 63 the method comprises processing the received data. In case the received checksum is not correct (NO at 61), in an embodiment at 62 a reset of one or more consistent values may be indicated. For example, a reason for an incorrect checksum may be that a rolling counter value is not consistent between transmitter and receiver. In this case, when the checksum is not correct a reset of the rolling counter value may be performed. In this respect, it should be noted that in embodiments the master may not know the exact reason for the checksum being incorrect, but merely potential reasons (for example incorrect data transmission, inconsistent rolling counter, wrong ID, i.e. wrong receiver sending etc.). If one of these potential reasons is an inconsistency of data between transmitter and receiver, for example inconsistency of a rolling counter, the reset may be caused.

In some embodiments, at 62 the indicated reset may also indicate to the slave device(s) that the last data sent should be transmitted again, as it may have been transmitted erroneously.

It should be noted that in yet other embodiments, a reset of the counter may be unnecessary, for example in embodiments where slave and master have a common time base and the counter is based on the time base.

In the following, some possibilities of indicating a reset in an SPC system or other bidirectional edge-based PWM system will be explained with reference to FIGS. 7 and 8.

In some embodiments, to indicate a reset a certain trigger pulse, for example a trigger pulse with a certain length, may be defined as a reset for all participants (e.g. slaves), for example all sensors coupled to a controller. Following receipt of such a reset trigger pulse, information to be kept consistent may be set to a predefined value. For example, a counter like a rolling counter may be reset to a defined starting value, for example 00 for a two-bit counter or 0000 for a four-bit counter, although other values may also be used. For example, a certain trigger pulse length of an ID which is not used by any slave may be used as a kind of reset ID. In other embodiments, a trigger pulse of a length greater than any length associated with a ID may be used. In some embodiments, using an ID as a reset ID may imply that one participant less may be used (as the ID is occupied by being a reset ID), and/or in a range mode one range less may be available. Using a specific trigger pulse as a reset pulse is illustrated in FIGS. 7A and 7B.

Figure 7A:
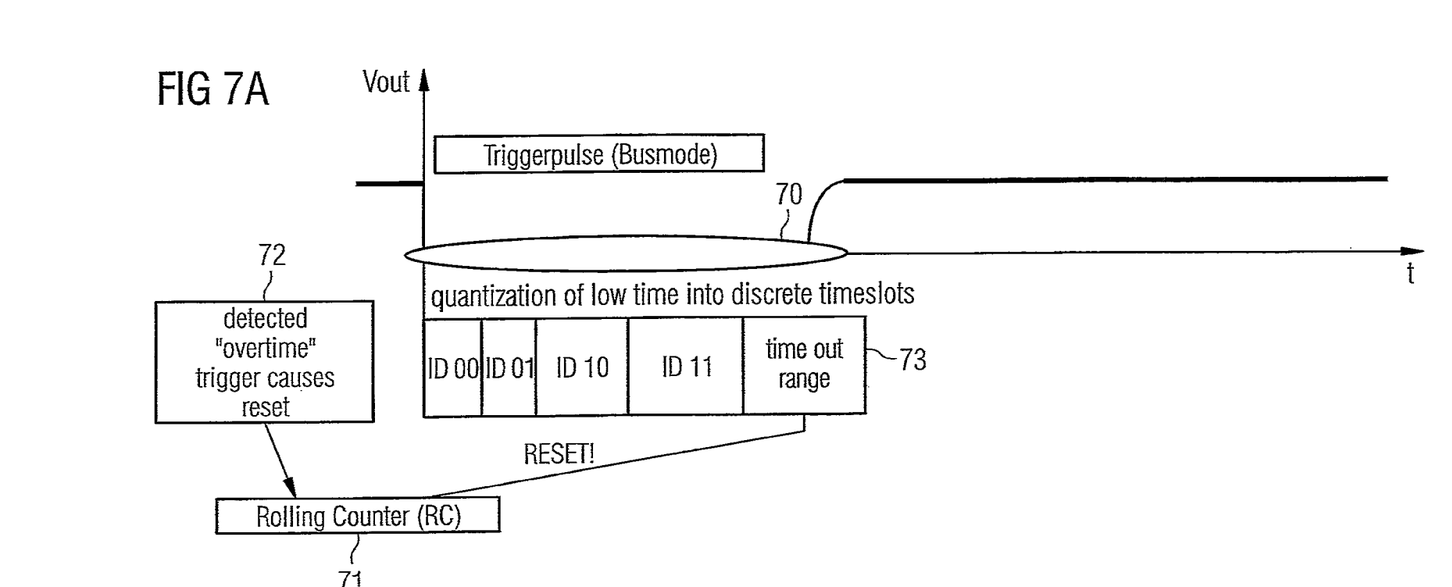
FIGS. 7A and 7B illustrate signals and techniques applicable in some embodiments.
Figure 8:
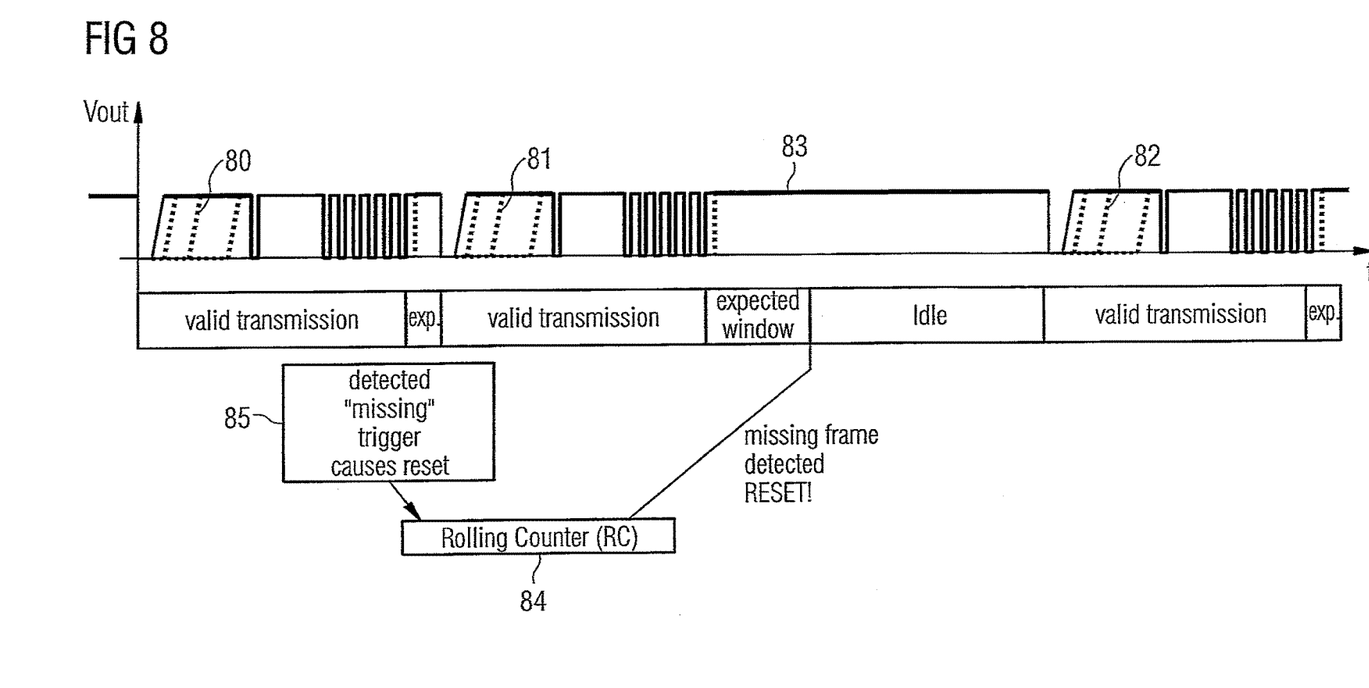
FIG. 8 illustrates signals and techniques applicable in some embodiments.

FIG. 7A illustrates a case where a length of a trigger pulse 70 is in a "timeout range", i.e. has a length longer than any length associated with an ID, as indicated in a box 73 in FIG. 7A. As indicated by a box 72, detection of such a trigger pulse causes a reset of a rolling counter 71 to a predefined value, for example a value of 00. Therefore, in FIG. 7A a trigger pulse longer than any ID (four possible IDs in the case of box 73) is used for causing a reset.

Figure 7B:
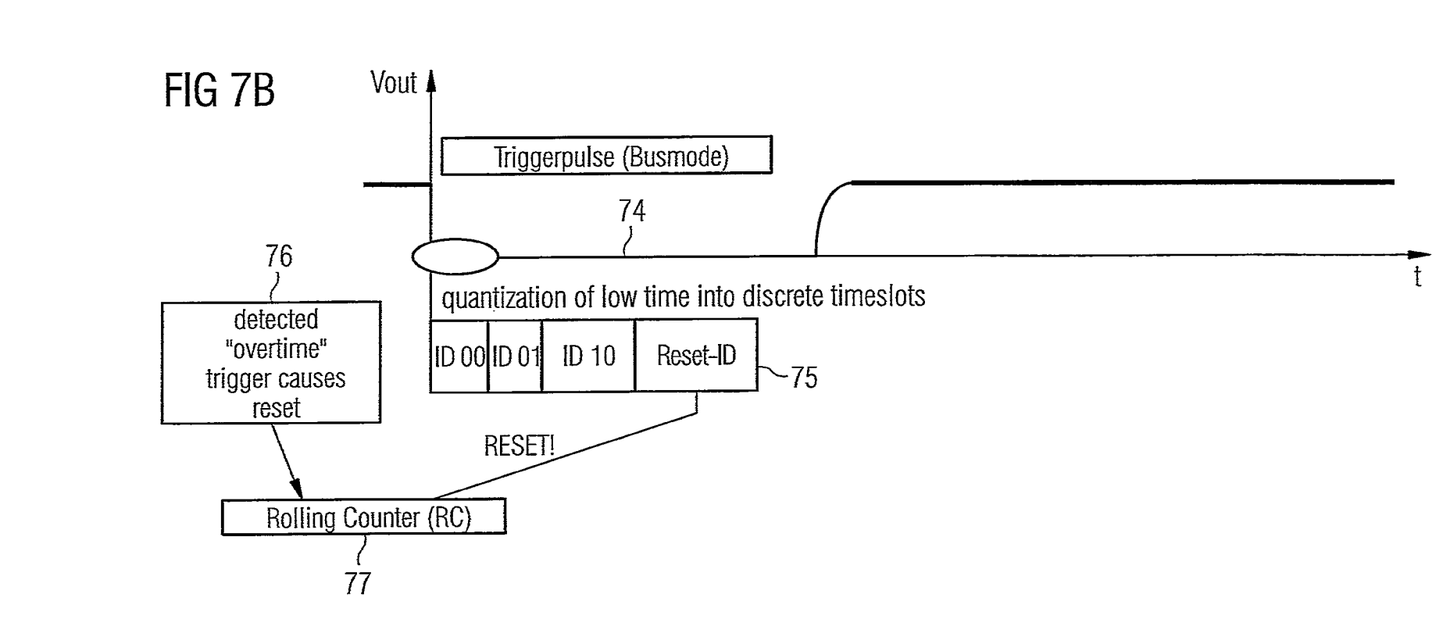

In the example of FIG. 7B, a trigger pulse 74 corresponding to a "reset ID" as indicated by a box 75 is used for triggering a reset. In this case, a length otherwise associated with an ID is used as a reset. A trigger pulse like trigger pulse 74 then, as indicated by box 76, causes a reset of rolling counter 77, for example a reset to a predefined value. In case of the embodiment of FIG. 7, an ID used as reset ID may not be used for identification of a bus participant, and so one bus participant less may be used (only IDs 00, 01, 10 available in the example of box 75). In contrast, in the embodiment of FIG. 7A it has to be ensured that trigger pulses longer than any ID (in the timeout range of box 73) can reliably be detected.

In another embodiment, a trigger pulse may be omitted, which the slaves may recognize as a timeout indicating a reset of a counter. This is illustrated in FIG. 8. In FIG. 8, trigger pulses 80, 81 and 82 are illustrated. At 83, a trigger pulse is omitted, i.e. within an expected window of a trigger pulse no trigger pulse is sent. As indicated by box 85, this may be interpreted as a reset, causing for example a resetting of a rolling counter 84 to a predefined value, for example a value of 0. It should be noted that in a system like the system of FIG. 2, a reset as illustrated in FIGS. 7 and 8 may apply to all slave devices, for example both sensors 24, 26 of FIG. 2. In other words, the trigger pulse (or omission of trigger pulse) indicating a reset is received by all slave devices, thus causing a global counter reset.

The above-mentioned reset approaches in embodiments have the property that a wrong timing leads to a "safe fault", as when the reset is not recognized, further errors will be detected, and when the reset (via timeout or a reset trigger pulse) is recognized the counter is set to a defined value.

In an alternative approach, a master device, instead of transmitting a reset, may test all counter values (e.g. 00, 01, 10, 11 for a two bit counter) to find the correct counter value (which may be detected by a correct checksum), which may be used as a basis for following transmission. In such an embodiment, the treatment of an error on the master side may require more processing time (for testing the counter values), on the other hand no additional transmissions like reset pulses or timeouts are necessary.

The above-described embodiments serve merely as examples, and are not to be construed as limiting.

What is claimed is:

1. A method, comprising:
   in a first device, calculating a checksum, where the checksum is calculated using data to be communicated to a second device, and information;
   communicating the data to be communicated and the checksum to the second device, while concurrently not communicating the information to the second device;
   receiving, at the second device, the data and the checksum; and
   determining, at the second device, whether the checksum is correct based on the data received and further information not communicated from the first device to the second device, where the information or the further information comprises at least one of an identification of the first device, a counter value generated at the first device, a measurement range used by the first device for a measurement, or a configuration of the first device.

2. The method of claim 1, further comprising at least one of:
   independently determining at least part of the information at the first device and at least part of the further information at the second device based on a predefined scheme which is applied by the first and second devices to a data communication between the first and the second device; or
   selecting at least part of the further information at the second device and
   communicating the at least part of the further information to the first device, wherein at least part of the information corresponds to the at least part of the further information as received at the first device.

3. The method of claim 1, further comprising setting the counter value to a predefined value when the checksum received at the second device is determined not to be valid by the second device.

4. The method of claim 3, wherein setting the counter value to a defined value comprises sending a dedicated trigger pulse from the second device to the first device, and setting the predefined counter value in response to receiving the dedicated trigger pulse.

5. The method of claim 4, wherein the dedicated trigger pulse corresponds to one of an unused identification or a trigger pulse different to any used identification or data pulse.

6. The method of claim 3, wherein setting the counter value to a defined value comprises omitting a trigger signal from the second device to the first device, and setting the counter to the predefined value in response to detecting the omission of the trigger pulse.

7. The method of claim 1, further comprising trying different counter values when the checksum received at the second device is determined not to be valid by the second device to determine a current counter value.

8. The method of claim 1, wherein the second device comprises at least one of a master device or a control unit.

9. The method of claim 1, wherein the first device comprises a sensor.

10. The method of claim 1, wherein the first device and the second device communicate on the basis of an edge-based pulse width modulation protocol.

11. A system comprising:
a first device;
a second device; and
a communication path between the first and second device, wherein the first device is configured to calculate a checksum, where the checksum is calculated using data to be communicated to a second device, and information; and to communicate the data to be communicated and the checksum to the second device, while concurrently not communicating the information to the second device,
wherein the second device is configured to receive the data and the checksum; and to determine whether the checksum is correct based on the data received and further information not communicated from the first device to the second device, where the information or the further information comprises at least one of an identification of the first device, a counter value generated at the first device, a measurement range used by the first device for a measurement, or a configuration of the first device.

12. A device, comprising:
a receiver that receives a checksum together with data from a further device, and
a checksum verification entity that determines whether the checksum is correct based on the data received and further information not received concurrently with the data and the checksum, where the further information comprises at least one of an identification of the further device, a counter value, a measurement range used by the further device for a measurement, or a configuration of the further device.

13. The device of claim 12, wherein information associated with the checksum comprises information comprised in a data frame associated with the checksum.

* * * * *